United States Patent
Paul et al.

(10) Patent No.: US 10,921,411 B2
(45) Date of Patent: Feb. 16, 2021

(54) METHOD AND DEVICE FOR CORRECTING A MAGNETIC RESONANCE COMBINED DATASET

(71) Applicant: Siemens Healthcare GmbH, Erlangen (DE)

(72) Inventors: Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 14 days.

(21) Appl. No.: 16/528,067

(22) Filed: Jul. 31, 2019

(65) Prior Publication Data

US 2020/0041599 A1 Feb. 6, 2020

(30) Foreign Application Priority Data

Jul. 31, 2018 (DE) .................... 10 2018 212 786

(51) Int. Cl.
*G01R 33/565* (2006.01)
(52) U.S. Cl.
CPC ............. *G01R 33/56509* (2013.01)
(58) Field of Classification Search
CPC .......... G01R 33/56509; G01R 33/4835; G01R 33/56383
See application file for complete search history.

(56) References Cited

U.S. PATENT DOCUMENTS

| 2008/0317315 | A1 | 12/2008 | Stemmer |
| 2013/0265045 | A1* | 10/2013 | Xu .................... G01R 33/56383 324/309 |
| 2014/0010428 | A1 | 1/2014 | Schmidt |
| 2015/0030229 | A1 | 1/2015 | Borsdorf et al. |

FOREIGN PATENT DOCUMENTS

| DE | 102007028660 B3 | 1/2009 |
| DE | 102012211892 A1 | 1/2014 |
| DE | 102013214479 A1 | 1/2015 |

OTHER PUBLICATIONS

German Office Action dated Aug. 1, 2019, German Application No. 10 2018 212 786.7.

\* cited by examiner

*Primary Examiner* — Susan S Lee
(74) *Attorney, Agent, or Firm* — Schiff Hardin LLP

(57) ABSTRACT

A combined dataset can be formed from partial datasets acquired at different positions of a patient support with a magnetic resonance device. The partial datasets can be of an anatomical region of a patient delimited perpendicularly to a longitudinal direction within an acquisition region. In a method for correcting the combined dataset formed from the partial datasets, for slices of a slice stack in the longitudinal direction of the combined dataset, information describing geometry of the anatomical region and/or an anatomical feature of the anatomical region is determined. For at least one slice group including adjacent slices, the geometry information is compared to detect one or more discontinuities. For at least one discontinuity of the one or more discontinuities satisfying a correction criterion, the combined dataset is corrected as a function of the geometry information to eliminate or reduce the at least one discontinuity.

13 Claims, 3 Drawing Sheets

METHOD AND DEVICE FOR CORRECTING A MAGNETIC RESONANCE COMBINED DATASET

CROSS REFERENCE TO RELATED APPLICATIONS

This patent application claims priority to German Patent Application No. 102018212786.7, filed Jul. 31, 2018, which is incorporated herein by reference in its entirety.

BACKGROUND

Field

The disclosure relates to a method and device for correcting a combined dataset, composed of partial datasets, acquired at different positions of a patient support with a magnetic resonance device, of anatomical region of a patient delimited perpendicularly to a longitudinal direction within the acquisition region.

Related Art

Magnetic resonance imaging is an imaging modality that has become established in the medical field to acquire image datasets of a patient. In this context it is often of interest to acquire a more extensive portion of the patient whose length goes beyond the homogeneity volume of the magnetic resonance device, for example, the entire legs of a patient and/or even the entire body of the patient. Corresponding acquisition programs are known, for example, as "Whole Body" or "Long Bone".

In corresponding imaging processes, the patient support is moved to different positions, where partial datasets respectively, for example in the form of axial slice stacks, are acquired. These partial datasets are then later combined into a single combined dataset, with the axially acquired slice stack often being reformatted into a coronal and/or sagittal slice stack in order to simplify an evaluation, in particular a diagnosis.

One problem with the combination of partial datasets, which were acquired at different positions of the patient support, is that the acquisition conditions can change in a variety of ways due to the movement of the patient support and the changed distribution of materials in the homogeneity volume. For example, there can be global changes in position and/or situation of the patient due to the movement, while the different material distribution in the homogeneity volume can lead to different influences on the magnetic fields used for imaging. For example, with different support positions, there can be different deviations of the gradient fields from the desired shape and the like.

Such imperfections lead to differences, for example geometric distortions, lack of geometric overlaps and the like, in particular even in the axial slices, with these differences manifesting themselves as disruptive artifacts in reformatted slice data. In particular when scanning two parallel extremities in a large acquisition region, for example both legs, the problem is that the distortions can have different effects on the extremities and therefore a global correction is challenging. In the prior art, a geometric distortion correction has already been proposed, which makes a correction of the distortions that occur due to gradient imperfections on the basis of the manufacturer-specified coefficients. However, this correction approach is based on theoretical calculations and in particular does not use patient- and/or installation site-specific conditions.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 schematically shows a sagittal slice image of a leg, according to an exemplary embodiment, to explain artifacts that may occur.

Figure 1:
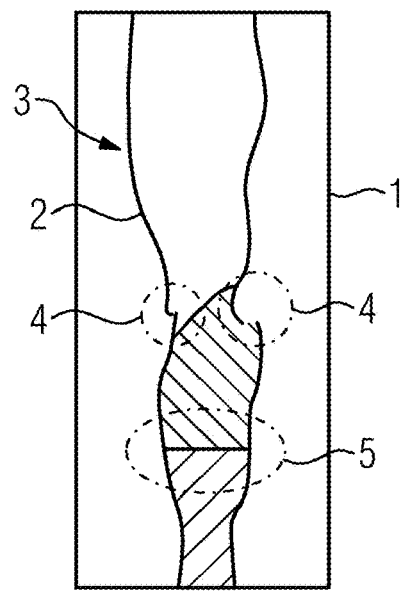

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure includes increasing the image quality of combined datasets, in particular in the form of reformatted slice stacks, which are composed of a plurality of partial datasets at different positions of the patient support.

In an exemplary embodiment, in a method of the type mentioned in the introduction it is inventively provided that for slices of a slice stack in the longitudinal direction of the combined dataset, at least one item of information describing the geometry of the anatomical region and/or an anatomical feature of the anatomical region is determined. For at least one slice group including at least adjacent slices, a comparison of the geometry information is made for the detection of a discontinuity and for at least one discontinuity that meets a correction criterion, a local correction of the combined dataset is made as a function of the geometry information to eliminate the discontinuity.

In this case, in particular in the case of acquisition of the partial datasets as axial slice stacks, a slice stack can already be present in which the at least one anatomical region including its limitations is contained. In an exemplary embodiment, if this is not the case, the slice stack, for whose slices the geometry information is determined and compared in each case, can also be determined by multiplanar reformation (MPR) or the like from the combined dataset. However, in an exemplary embodiment, partial datasets are acquired as axial slice stacks and the geometry information for the slices acquired as partial datasets is determined. In most cases, the process is in any case such that the partial datasets adjoin each other, in particular with little or no overlap.

In an exemplary embodiment, the geometry of the anatomical region and/or at least one anatomical feature of the anatomical region in adjacent slices is analyzed. These geometry properties, which are described by the geometry information, can be compared between adjacent slices of the slice stack, so with respect to at least one of these geometry properties, discontinuities between two adjacent slices can be detected. For example, a "jump" in position and/or in the expansion can be detected. In other words, it is assumed that the geometry properties, the geometry information therefore, should be essentially continuous over the slice stack, without major jumps therefore, and thus sufficiently "flat". In an exemplary embodiment of the method, a correction criterion is provided, which in case of excessive discontinuities, where a distance between geometry information can be used, initiates a correction, which aims to eliminate the discontinuity. In an exemplary embodiment, at least for the correction between which a discontinuity was identified, consideration is not limited to two adjacent slices, but the course of the affected geometry properties is considered over a larger number of slices in order not to create new discontinuities to be correlated due to elimination of one discontinuity. However, it is also conceivable to ultimately carry out the correction in a recursive manner, for example to correct discontinuities between different pairs of adjacent slices until no remaining discontinuity meets the correction criterion.

In this way it is possible to avoid artifacts and/or other image quality interference, in particular in the case of representations of the combined dataset reproducing other views, for example in sagittal and/or coronal reformatted slice stacks, so the image quality is significantly improved and improved diagnosis is possible.

It should be noted at this point already that usually the deviation between geometry information already contains an indication of the type of discontinuity, so the correction is made by taking into account the geometry information in one or more embodiments. Of course it is also conceivable, however, to determine firstly in a fairly general way whether there is a relevant discontinuity in order only then by further analysis and in particular the determination of correction information, for example of form parameters, to find correct geometry properties that are specifically to be corrected, so the correction can be made by taking into account the geometry information and/or the correction information.

In an exemplary embodiment of the present disclosure, at least part of the geometry information is determined by registering the slices on a common reference dataset, in particular an anatomical atlas. In an exemplary embodiment, there is a non-rigid, in other words elastic, registration of individual slices with an anatomical atlas model, which serves as a reference dataset. If the geometries of adjacent slices were to adjoin each other sufficiently consistently, it would be expected that comparable registration parameters, which serve as geometry information here, would also be available. However, each of these registry parameters describes specific geometric properties, more precisely, differences in geometric properties to the reference dataset, so differences between geometry properties of adjacent slices can also be inferred herefrom and according to the registration parameters, it is also possible to derive what kind of discontinuity is involved, so the correction can be made in a targeted manner when a correction criterion is met as a function of the registration parameters. It should be emphasized here that no correction or other kind of adaptation to the reference dataset is made since this would falsify the data of the specific patient; the reference dataset serves only as a common basis for comparison and therefore for expedient determination of the comparable geometry information in the form of the registration parameters that uses known methods and algorithms.

However, since it is precisely non-rigid registrations, as are preferred, that can entail a relatively high computational effort, other approaches can optionally prove to be more computationally efficient. Therefore, in an exemplary embodiment of the present disclosure, at least part of the geometry information is determined on the basis of a segmentation of a contour of the anatomical region and/or the anatomical feature. In particular, if, as is the case for example with extremities or the like, the contour of the anatomical region is completely contained in the slices of the slice stack in the longitudinal direction, in particular when using axial slice stacks therefore, a segmentation of the anatomical region, which has to be delimited from air, may be implemented particularly simply, robustly and in a less computationally laborious manner. However, this can also apply to particular anatomical features that clearly stand out in the magnetic resonance data of the combined dataset. One example of such anatomical features of the anatomical region that are equally easy to segment are bones. In this case, conventional segmentation algorithms can be used for segmentation. Advantageously, it can be provided that segmentation is carried out according to the method of the active contours. In particular, a conventional snake algorithm can be used. It is precisely in the case of anatomical regions and bones formed as extremities as the anatomical features that it has been found that active contours are particularly well placed around these features and therefore allow reliable and computationally efficient contour determination when evaluating the slices.

Known contours of the anatomical region and/or anatomical features are an excellent starting point for finding geometry differences between adjacent slices. Therefore, in an exemplary embodiment of the present disclosure, a center point of the contour is determined as the geometry information. In this example, from a comparison of the center points of two adjacent slices, a displacement between the slices is inferred and/or that an extent value of the contour, in particular an area bordered by the contour, is determined as the geometry information. In an exemplary embodiment, a compression or extension is inferred from a comparison of the areas of two adjacent slices. In addition to the area as an extent value, it is also conceivable, moreover, to determine at least one geometry parameter of the approximated shape, for example semi-axis of an ellipse, as an extent value when the contour is approximated by a geometric shape. Such a geometry parameter also provides information about the type of deformation and can therefore be used as a form parameter during a correction, and this will be discussed in more detail below. It should be noted in this connection that such an approximation by way of a geometric shape can also serve as a basis for finding the center point of the contour, moreover.

In the context of the present disclosure, a breakdown of the correction problem into two partial aspects is ultimately carried out, namely, on the one hand, a displacement of the anatomical region compared to an adjacent slice and, on the other hand, a compression/extension of the anatomical region with respect to an adjacent slice. This is particularly expedient in that both effects may also be treated separately in the correction, in particular successively.

A possible rigid displacement is described by the course of the center point in the longitudinal direction. In the event of a rigid displacement, an immediate quantification and correction can be made on the basis of the determined discontinuity. An initial correction of the rigid displacement simplifies subsequent steps. Discontinuities in the extent value, for example the area, indicate a distortion (compression or extension). On the basis of the thinning of the contour it is then possible to infer in which direction the correction must be made. In this example, it is precisely in this case that the extent value over more than the two slices, between which the discontinuity occurs, can be considered.

Specifically, therefore, it can be provided that in the case of a displacement relevant to the correction criterion, this is corrected on at least one side of the discontinuity by a translation of at least one slice, in particular of a plurality of slices, to avoid a new discontinuity and/or recursively until the correction criterion is not met for any side of the at least one translated slice, and/or at least in the case of a compression or extension relevant to the correction criterion, at least one form parameter of the contours of the adjacent slices is determined and/or at least one of the at least one extent value is used as a form parameter. In an exemplary embodiment, by comparing the form parameters, deformation information describing the type of compression and/or extension is determined, which is used to parameterize an equalization algorithm to be applied to at least one slice on at least one side of the discontinuity.

Moreover, in contrast to a "recursive" approach, in which, ultimately, a discontinuity is "pushed through" at one side of the entire slice stack by only ever considering two adjacent slices where the discontinuity occurs, exemplary embodiments provide that the course of the geometry information, for example in this case the center point and the extent value, is considered over a larger number of slices in order to make an overall correction. As far as, for example, the rigid displacement is concerned, an entire partial dataset, for example all slices of an axial slice stack of a partial dataset, can have a particular common rigid displacement, so a common correction equal to all of these slices can also be made here. Distortions are usually local, so, for example, a transition function can be found that makes it possible to convert the discontinuity in a sufficiently continuous transition, which in this case should be limited to as small a range as possible, to as few slices as possible therefore. Comparable algorithms have already been proposed, for example in the field of stitching in the case of two-dimensional X-ray images.

As already mentioned, it is also generally expedient to apply a correction comprising at least two steps, in particular a translation followed by a deformation correction. An initial correction of a rigid displacement simplifies the application of deformation corrections, for example by equalization algorithms. It is again pointed out in this connection that it is of course already expedient to use this division into different partial effects as early as in the geometry information, since it can be provided that geometry information related to the rigid displacement and geometry information based on a deformation are determined.

The anatomical region can be an extremity of the patient, such as a leg, but is not limited thereto. The disclosure can also be applied to other extremities, however, for example arms or the like. A consideration for whole body combined datasets is conceivable in one or more aspects. In addition or alternatively, a bone can be used as an anatomical feature since these, as has already been explained, can be segmented particularly easily. Other features that stand out clearly in magnetic resonance data can also be used as an anatomical feature.

In a particularly advantageous aspect of the present disclosure it can be provided that in an anatomical region comprising a plurality of anatomical regions, the correction is carried out separately for each anatomical region. If, for example, both legs of a patient are contained in a common combined dataset, an extremity-specific correction can be made, so a corresponding division of the acquisition region according to anatomical regions can be carried out. In this way a plurality of extremities, in particular both legs, can be considered separately. This is because investigations have shown that, in particular, distortions can also have different effects on extremities, so an extremity-specific correction allows a significant, further improvement of the image quality.

In addition to the method, the disclosure also relates to a magnetic resonance device, having a controller configured to carrying out the method described herein. All statements in respect of the exemplary embodiments of the method are analogously applicable to the magnetic resonance device, with which therefore the advantages already mentioned can likewise be obtained. In an exemplary embodiment, the controller includes at least one processor and/or at least one storage means (e.g. internal and/or external memory). Functional units (e.g. processing modules of the processor) can be used for carrying out various steps of the method. For example, the controller can therefore use a determiner to determine the geometry information, a comparator to compare the geometry information, an evaluator to evaluate the correction criteria, and a corrector/adjuster to carry out the correction.

In an exemplary embodiment, a computer program can, for example, be loaded directly into a memory of an arithmetic device, in particular a controller of a magnetic resonance device that is configured to carry out the steps of the aspects of the method described herein when the computer program is run/executed in the arithmetic device (controller). The computer program can be stored on an electronically readable data carrier, which therefore comprises electronically readable control information stored thereon, which comprises at least one aforementioned computer program and is therefore designed in such a way that it carries out a method when the data carrier is used in an arithmetic device, in particular a controller of a magnetic resonance device. The electronically readable data carrier (e.g. computer readable medium) can be, in particular, a non-transient data carrier, for example a CD-ROM.

The present disclosure deals with cases in which an image acquisition region of a patient, comprising at least one anatomical region, is acquired over the entire length with a magnetic resonance device. For this purpose, in particular, axial slice stacks are acquired as partial image datasets at different positions of the patient support. That is, different parts of the anatomical region are successively placed in the homogeneity volume (field of view) of the magnetic resonance device. The axial slices of the partial datasets are then joined together into an overall axial slice stack of a combined dataset. For this combined dataset useful slice images are derived for the diagnosis, for example by multiplanar reformatting. In particular, coronal and/or sagittal views/slices are generated here. Due to the movement of the patient support and the associated change in the homogeneity volume, there are different acquisition conditions for the different partial datasets, and these manifest themselves as artifacts in the final, in particular coronal and/or sagittal, views to be displayed. FIG. 1 shows schematically and by way of example a coronal or sagittal slice 1 of a leg 2, derived from a combined dataset, as the anatomical region 3. Due to the different acquisition geometries, discontinuities occur in the edge curve (e.g. regions 4), and/or occur in the contrast course (e.g. region 5), which can result, for example, from compression and/or extension effects.

The present disclosure deals with the correction of image artifacts of this kind, in particular due to reformatting, in slices derived from combined datasets composed of partial datasets.

Figure 2:
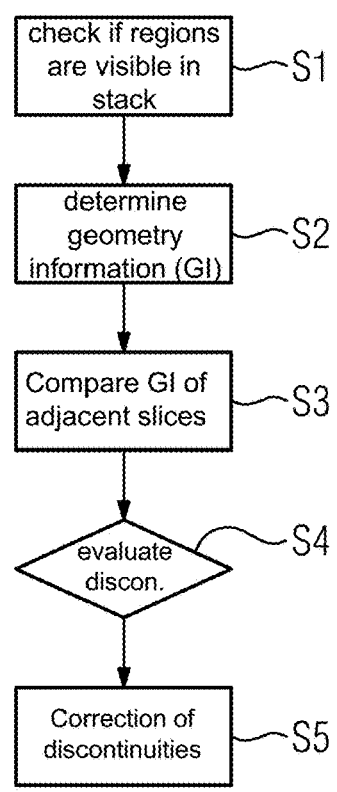
FIG. 2 shows a flowchart of a method according to an exemplary embodiment of the disclosure.

FIG. 2 shows a flowchart of a correction method according to an exemplary embodiment. There, in a step S1, it is firstly checked whether a plurality of anatomical regions, for example both legs 2, can be seen in the axial slice stack resulting from the joining together of the partial datasets. If this is the case, the magnetic resonance data, therefore the axial slices, are divided into proportions according to the anatomical regions. That is, each anatomical region is considered separately, in the present case for example each leg. For the sake of simplicity the following steps shall be described as an example only for one of these anatomical regions, even if they are applied to both legs.

Figure 3:
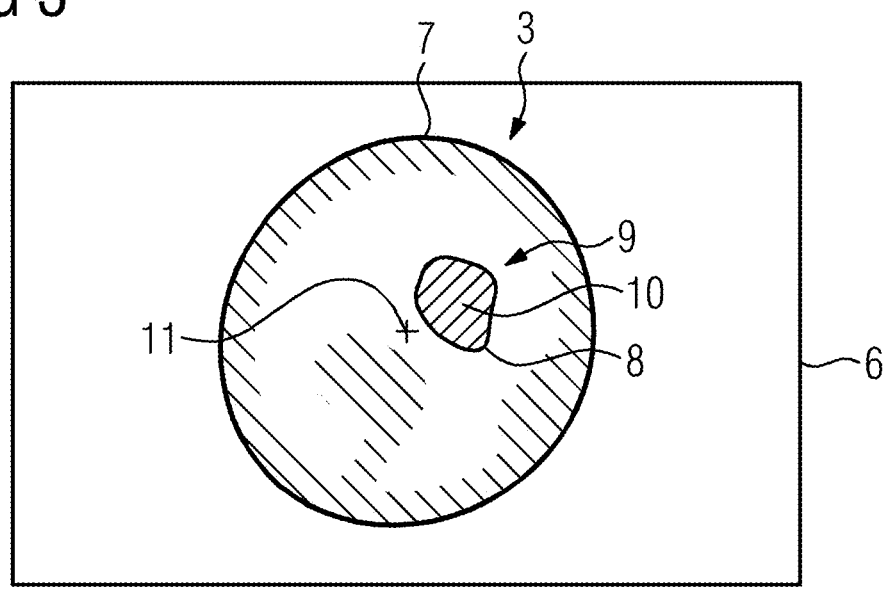
FIG. 3 shows a schematic representation of an axial slice image of a leg according to an exemplary embodiment of the disclosure.

In a step S2, geometry information is determined by evaluation of the magnetic resonance data of each of the axial slices of the slice stack, in the present case a center point of the leg 2 as an anatomical region 3 and a surface area of the leg 2 as extent value respectively, with alternative extent values also being conceivable here, which are suitable for later use as form parameters. This shall be explained in more detail with regard to FIG. 3. This shows a schematic reproduction of an axial slice 6 of the slice stack of the combined dataset.

In a first partial step of step S2, the contours 7 of the anatomical region 3, here of the respective leg 2, are now determined in all these axial slices 6. This is easily possible due to the clear demarcation of the anatomical region 3 from the surrounding air. The method of active contours is applied here. Optionally, a contour 8 of a further anatomical feature 9, here of a bone 10, can be determined if a refinement of the geometry information is desired. However, as has been shown, this is not imperative.

In a further partial step, geometry information is now determined using the contour 7 (and optionally also the contour 8), in the present case at least one center point 11 of the contour 7 and an area enclosed by the contour 7.

It should be noted at this point that geometry information can also be determined in other ways, for example by elastic registration on a reference dataset, in particular an anatomical atlas model, with the various registration parameters likewise representing registration information describing the geometry.

In a step S3, the geometry information of adjacent slices 6 is compared in order to determine discontinuities in the course. This shall be explained in more detail with regard to FIG. 4, which shows the position of the center point 11 (axis 12) in its course 13 over the slices 6 (axis 14). Clearly, a discontinuity 16 results here as a jump in the position of the center point 11 at a transition between partial datasets, which can also be called a station transition 15.

Figure 5:
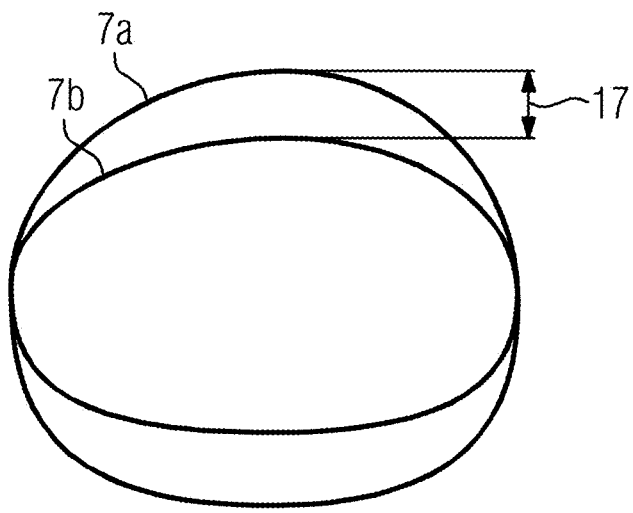
FIG. 5 is an illustration of the effect of a compression according to an exemplary embodiment of the disclosure.

Similar discontinuities can also result for the area as geometry information, cf. for example FIG. 5, in which contours 7a, 7b of adjacent slices 6 are shown by way of example. Clearly, contour 7b is compressed with respect to contour 7a, so here too, a corresponding discontinuity 17 results.

It should be pointed out again at this point that it is not imperative for the area to be used as an extent value; instead it is also possible to use other extent values, for example to approximate the contours 7, 7a, 7b as ellipses and to determine their large and small half-axes as extent values, so the comparison then also provides a direct indication of the type of discontinuity and the correction possibly required.

Figure 4:
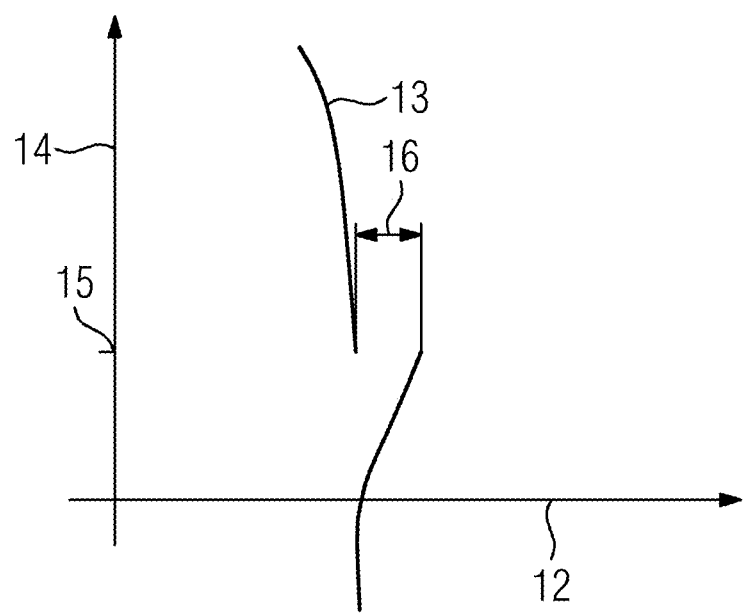
FIG. 4 shows a course of a center point over axial slices of a slice stack according to an exemplary embodiment of the disclosure.

With reference to FIG. 2, in step S4, the discontinuities are evaluated by correction criteria. If one of the correction criteria indicates a need for a correction, for example a discontinuity exceeding a threshold value, the discontinuity is corrected in a step S5. In an exemplary embodiment, consideration is given not only to the adjacent slices 6, where the discontinuity has occurred, but to a larger slice group to at least one side to perform the correction. By using a larger slice group, bringing about a new discontinuity by eliminating the corresponding discontinuity 16, 17 can be avoided. If, for example, the course 13 in FIG. 4 is considered, it can be seen that the displacement shown there is smaller for further slices, so here, for example using an optimization algorithm, an optimally steady transition which distorts the magnetic resonance data as little as possible can be created and corresponding corrections, which eliminate the discontinuity 16, can be eliminated by rigid displacement of slices 6 of at least one side of the discontinuity 16. This rigid displacement, which results on the basis of the course 13 of the center point 11, is also carried out in a first correction step since the further corrections in step S5, if they are necessary, are then simplified.

In this example, a further partial step of step S5, a correction of the distortion (e.g. the compression and/or elongation) can then take place. In an exemplary embodiment, as the discontinuity 17, specifically descriptively, the extent values of the geometry information can be used. Optionally, also complementarily, form parameters such as the semi-axes can be used. A corresponding equalization algorithm, which ideally also affects a plurality of slices on at least one side of the discontinuity 17, can be parameterized and applied.

The result is an axial slice stack of the combined dataset, which is corrected of discontinuities 16, 17 as far as possible, from which qualitatively improved coronal and sagittal slices can be derived.

Figure 6:
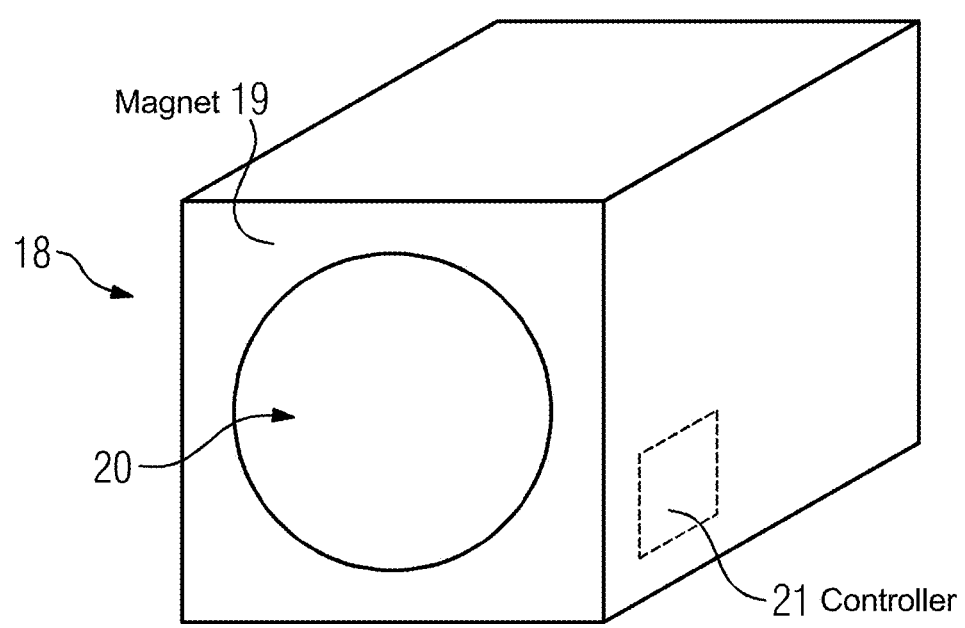
FIG. 6 shows a magnetic resonance device according to an exemplary embodiment of the disclosure.

FIG. 6 shows a schematic diagram of a magnetic resonance device 18 according to an exemplary embodiment. In an exemplary embodiment, the magnetic resonance device 18 includes a main magnet 19, in which a cylindrical patient receiving device (examination chamber/scanning space) 20 is formed, in which the patient can be placed in different positions using a patient support (not shown in detail here), for example to acquire the different partial datasets. The magnetic resonance device 18 can also be referred to as MR scanner 18. The operation of the magnetic resonance device 18 is controlled by a controller 21, which is also configured to perform the method of the exemplary embodiments. In an exemplary embodiment, the controller 21 includes a determiner configured to determine the geometry information, a comparator configured to compare the geometry information of adjacent slices 6, an evaluator configured to check the correction criteria and a corrector configured to perform the correction. In an exemplary embodiment, the determiner, comparator, evaluator, and a corrector are embodiment in one or more processors of the controller 21. In an exemplary embodiment, the controller 21 includes processor circuitry that is configured to perform one or more functions/operations of the controller 21, including controlling the magnetic resonance device 18.

In an exemplary embodiment, a terminal (not shown) can be communicatively coupled to the magnetic resonance device 18. The terminal can include a display, a keyboard and a mouse for a graphical user interface. The terminal serves as user interface by which a user operates the controller and thereby the magnetic resonance device 18. In an exemplary aspect, the terminal may be an integral component of the magnetic resonance device 18. In an exemplary embodiment, the terminal includes processor circuitry that is configured to perform one or more functions/operations of the terminal. In an exemplary embodiment, the terminal is a computer that is configured to execute one or more internally and/or externally stored applications to perform the functions/operations of the terminal.

Although the disclosure has been illustrated and described in detail by the preferred embodiment, it is not limited by the disclosed examples and a person skilled in the art can derive other variations herefrom without departing from the scope of the disclosure.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computers, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, programmable processing circuit, other structural electronic hardware, or a combination thereof. A processor includes a microprocessor, a digital signal processor (DSP), central processing unit (CPU), application-specific instruction set processor (ASIP), graphics and/or image processor, multi-core processor, or other hardware processor. The processor may be "hard-coded" with instructions to perform corresponding function (s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for correcting a combined dataset formed from partial datasets acquired at different positions of a patient support with a magnetic resonance device, the partial datasets being of an anatomical region of a patient delimited perpendicularly to a longitudinal direction within an acquisition region, the method comprising:
   determining, for slices of a slice stack in the longitudinal direction of the combined dataset, information describing geometry of the anatomical region and/or an anatomical feature of the anatomical region;
   for at least one slice group including adjacent slices, comparing the geometry information to detect one or more discontinuities; and
   for at least one discontinuity of the one or more discontinuities satisfying a correction criterion, correcting the combined dataset as a function of the geometry information to eliminate or reduce the at least one discontinuity.

2. The method as claimed in claim 1, wherein at least part of the geometry information is determined by registering the slices on a common reference dataset.

3. The method as claimed in claim 1, wherein at least part of the geometry information is determined based on a segmentation of a contour of the anatomical region and/or the anatomical feature.

4. The method as claimed in claim 3, wherein the segmentation is carried out according to an active contours process.

5. The method as claimed in claim 3, wherein:
a center point of the contour is determined as the geometry information,
from a comparison of center points of the two adjacent slices, a displacement between the slices is inferred and/or an extent value of the contour including an area bordered by the contour is determined as the geometry information, and
a compression or extension is inferred from a comparison of areas of the adjacent slices.

6. The method as claimed in claim 5, wherein:
for the displacement relevant according to the correction criterion, the displacement is corrected on at least one side of the at least one discontinuity by a translation of at least one slice of the slices to avoid a new discontinuity, and/or the displacement is recursively corrected until the correction criterion is not satisfied for any side of the at least one translated slice; and/or
for a compression or extension relevant to the correction criterion, at least one form parameter of the contours of the adjacent slices is determined and/or the extent value is used as a form parameter, wherein deformation information describing a type of the compression and/or extension is determined based on the form parameter, the deformation information being used to parameterize an equalization algorithm to be applied to at least one slice of the slices on at least one side of the at least one discontinuity.

7. The method as claimed in claim 1, wherein the correcting comprises a translation of at least one slice of the slices followed by a deformation correction.

8. The method as claimed in claim 1, wherein the anatomical region is an extremity of the patient and/or the anatomical feature is a bone.

9. The method as claimed in claim 1, wherein, the anatomical region includes a plurality of anatomical regions, the correction being performed separately for each of the plurality of anatomical regions.

10. The method as claimed in claim 1, further comprising providing an electronic signal representing the corrected combined dataset as an output of the magnetic resonance device.

11. A magnetic resonance device comprising:
a controller configured to perform the method as claimed claim 1; and
a magnetic resonance scanner configured to generate the partial datasets and provide the partial datasets to the controller.

12. A non-transitory computer-readable storage medium with an executable program stored thereon, that when executed, instructs a processor to perform the method of claim 1.

13. A computer program product having a computer program which is directly loadable into a memory of a controller of the magnetic resonance device, when executed by the controller, causes the magnetic resonance device to perform the method as claimed in claim 1.

* * * * *